United States Patent
Flachowsky et al.

(10) Patent No.: US 8,501,601 B2
(45) Date of Patent: Aug. 6, 2013

(54) DRIVE CURRENT INCREASE IN FIELD EFFECT TRANSISTORS BY ASYMMETRIC CONCENTRATION PROFILE OF ALLOY SPECIES OF A CHANNEL SEMICONDUCTOR ALLOY

(75) Inventors: Stefan Flachowsky, Dresden (DE); Thilo Scheiper, Dresden (DE); Steven Langdon, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/239,672

(22) Filed: Sep. 22, 2011

(65) Prior Publication Data
US 2012/0193708 A1 Aug. 2, 2012

(30) Foreign Application Priority Data
Feb. 1, 2011 (DE) .................. 10 2011 003 439

(51) Int. Cl.
*H01L 21/425* (2006.01)
(52) U.S. Cl.
USPC ................. 438/514; 257/E21.618
(58) Field of Classification Search
USPC ........... 257/335, E21.427, E21.618; 438/217, 438/276, 514
See application file for complete search history.

(56) References Cited

U.S. PATENT DOCUMENTS

| 5,777,364 | A | * | 7/1998 | Crabbe et al. | 257/347 |
| 6,355,963 | B1 | | 3/2002 | Hiroki et al. | |
| 2007/0045611 | A1 | * | 3/2007 | Zhu et al. | 257/20 |
| 2007/0298557 | A1 | | 12/2007 | Nieh et al. | |
| 2010/0078653 | A1 | * | 4/2010 | Griebenow et al. | 257/77 |
| 2010/0163939 | A1 | * | 7/2010 | Kronholz et al. | 257/288 |
| 2010/0193882 | A1 | * | 8/2010 | Hoentschel et al. | 257/410 |
| 2011/0121398 | A1 | * | 5/2011 | Hoentschel et al. | 257/369 |

OTHER PUBLICATIONS

Translation of Official Communication from German Patent Application No. 10 2011 003 439.0 dated Aug. 1, 2012.
Translation of Official Communication from German Patent Application No. 10 2011 003 439.0 dated Jan. 24, 2013.

* cited by examiner

*Primary Examiner* — Quoc Hoang
(74) *Attorney, Agent, or Firm* — Williams, Morgan & Amerson, P.C.

(57) ABSTRACT

When forming sophisticated transistors, the channel region may be provided such that the gradient of the band gap energy of the channel material may result in superior charge carrier velocity. For example, a gradient in concentration of germanium, carbon and the like may be implemented along the channel length direction, thereby obtaining higher transistor performance.

15 Claims, 6 Drawing Sheets

DRIVE CURRENT INCREASE IN FIELD EFFECT TRANSISTORS BY ASYMMETRIC CONCENTRATION PROFILE OF ALLOY SPECIES OF A CHANNEL SEMICONDUCTOR ALLOY

BACKGROUND OF THE INVENTION

1. Field of the Invention

The present disclosure generally relates to the fabrication of integrated circuits, and, more particularly, to the adjustment of characteristics of individual field effect transistor elements so as to enhance the performance thereof.

2. Description of the Related Art

Integrated circuits typically include a large number of individual circuit elements, such as transistors, capacitors, resistors and the like. For enhancing overall performance of the integrated circuit, usually the number of individual circuit elements is increased, thereby implementing more and more functions into the circuit, and associated therewith the feature sizes of the individual circuit elements are reduced, thereby enhancing performance of the individual circuit elements, in particular of the transistors, which represent the dominant components in complex circuits. Generally, a plurality of process technologies are currently practiced, wherein, for logic circuitry, such as microprocessors, storage chips and the like, MOS technology is one of the most promising approaches due to the superior characteristics in view of operating speed, manufacturing costs and/or power consumption. During the fabrication of complex integrated circuits using MOS technology, millions of transistors, i.e., N-channel transistors and/or P-channel transistors, are formed in and on an appropriate semiconductor material, wherein currently the vast majority of logic circuitry is fabricated on the basis of silicon. Typically, a MOS transistor, irrespective of whether an N-channel transistor or a P-channel transistor is considered, comprises so-called PN junctions that are formed by an interface of highly doped drain and source regions with a channel region disposed between the drain region and the source region, wherein the channel region is weakly doped with respect to the drain and source regions. The conductivity of the channel region, which represents an essential device criterion, as the reduced current drive capability of scaled devices with reduced transistor width has, at least partially, to be compensated for by an increased conductivity, is controlled by a gate electrode formed adjacent to the channel region and separated therefrom by a thin insulating layer. The conductivity of the channel region depends on, among other things, the dopant concentration, the mobility of the charge carriers and, for a transistor width, the distance between the source and drain regions, which is also referred to as channel length. In addition to the conductivity of the channel region in the saturated state and the linear operating state of the transistor, performance is also significantly influenced by the transistor's capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuits. For instance, static and dynamic leakage currents may significantly affect the overall performance of an integrated circuit, as the achievable amount of heat dissipation that is required for transistor architectures producing high dynamic and/or static leakage currents may restrict the maximum practical operating frequency.

Furthermore, sophisticated lateral and vertical dopant profiles may be required in the drain and source regions so as to maintain controllability of the channel region for a channel length of approximately 50 nm and significantly less, as is typically applied in modern transistor elements. As is well known, short channel effects may require a reduction of the thickness of the gate insulation layer which, however, may no longer be a viable option on the basis of silicon dioxide since, at a thickness of approximately 1 nm, significant leakage currents may occur, as explained above. Appropriate design countermeasures on the other hand may be accompanied by a reduction of channel conductivity, which has resulted in advanced strain engineering techniques for creating a desired type of strain in the channel region which may enhance charge carrier mobility therein. For example, for a standard crystallographic orientation of a silicon layer, i.e., a (100) surface orientation with the channel length directed along a <110> crystal axis, creating a tensile strain along the channel length direction may significantly enhance electron mobility, which thus leads to increased drive current capability of an NMOS transistor.

Similarly, a compressive strain in the channel region of P-channel transistors for a standard crystallographic configuration may result in a superior mobility of holes, thereby also enhancing overall transistor performance of P-channel transistors. One mechanism that is frequently applied in sophisticated P-channel transistors is the incorporation of a silicon/germanium alloy in the drain and source areas, which may be grown in corresponding cavities on the basis of epitaxial growth techniques, thereby achieving a strained state which in turn may act on the adjacent channel region, thereby inducing the required type of strain therein.

Moreover, as discussed above, upon further scaling the overall transistor dimensions, the gate electrode structures may be appropriately adapted so as to provide the required controllability of the channel region. Since a further reduction of the thickness of well-established silicon dioxide-based gate dielectric materials may be less than desirable due to the significant increase of leakage currents, the capacitive coupling between the gate electrode and the channel region is frequently increased by providing a high-k dielectric material in sophisticated gate electrode structures. Generally, a high-k dielectric material may be understood hereinafter as a dielectric material having a dielectric constant of 10.0 and higher, as determined by well-established measurement techniques. For example, a plurality of compounds including metals, such as hafnium, zirconium, aluminum and the like, may be used as high-k dielectric materials. Furthermore, since an appropriate work function of the electrode material of any such sophisticated gate electrode structures may no longer be obtained on the basis of doped polysilicon material and due to polysilicon's characteristic to form a depletion zone in the vicinity of the gate dielectric material upon operating the transistor, a metal-containing electrode material is typically formed above the high-k dielectric material. To this end, appropriate metal species have to be incorporated, such as lanthanum, aluminum and the like, possibly in combination with appropriate carrier materials, such as tantalum, tantalum nitride, titanium nitride and the like. In some sophisticated approaches for providing high-k metal gate electrode structures, the high-k dielectric material and the associated work function metal species and electrode material may be provided in an early manufacturing stage, wherein additionally a well-established electrode material, such as silicon, may be used in combination with a work function adjusting electrode material, thereby providing a certain degree of compatibility with conventional gate electrode structures. Since typically, in complex semiconductor devices, transistors of different threshold voltage may have to be applied, thereby requiring highly complex dopant profiles in the channel region and the adjacent drain and source regions, it may be increasingly difficult to comply with these requirements on the basis of sophisticated gate electrode structures, even if different work function metal species may be provided, for instance for P-channel transistors and N-channel transistors, respectively. For example, in some cases, it may be advantageous to incorporate a semiconductor material of appropriately designed electronic characteristics in order to obtain the desired threshold voltage in combination with sophisticated high-k metal gate electrode structures. To this end, frequently silicon/germanium may be provided in the channel region of P-channel transistors so as to obtain a pronounced offset of the band gaps of P-channel transistors and N-channel transistors, since a silicon/germanium alloy has a reduced band gap compared to the silicon base material. Consequently, a plurality of process techniques have been developed based on the technical experience obtained for processing silicon and germanium materials in order to appropriately incorporate a silicon/germanium alloy, for instance in the channel region and/or in drain and source areas for providing appropriately adapted electronic characteristics and/or specific strain conditions, in particular in P-channel transistors.

Although the incorporation of silicon/germanium alloys in sophisticated transistors may provide superior performance, in particular for P-channel transistors comprising a high-k metal gate electrode structure, a further reduction of the critical dimensions, for instance the gate length of planar transistors to 40 nm and less, may not be associated with a corresponding increase of overall transistor performance without implementing additional performance enhancing mechanisms, which may specifically relate to an increase of charge carrier mobility in the channel regions of the transistors. For example, it has been proposed to incorporate materials selectively in the silicon base material, which are known to have a higher intrinsic charge carrier mobility compared to silicon, silicon/germanium and the like. It turns out, however, that the incorporation of any such materials is associated with a high risk of device failures since many process steps and integration aspects are still completely unknown in the field of forming sophisticated silicon-based semiconductor devices. Moreover, the electronic characteristics of these materials may result in lower gate capacitance, reduced inversion layer density and thus reduced drive current compared to silicon/germanium materials.

In view of the situation described above, the present disclosure relates to semiconductor devices and manufacturing techniques in which sophisticated transistor elements may be provided with superior performance, while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which performance of transistors may be enhanced by implementing a gradient with respect to the band gap of the channel material, wherein the corresponding gradient is substantially oriented along the current flow direction in the channel region. According to the principles disclosed herein, it has been recognized that a gradual variation of the band gap, for instance a gradual variation of the valence band edge for a P-conductive transistor, may result in an increased charge carrier velocity for a given drain and source voltage compared to a corresponding channel region formed on the basis of a silicon base material. In some illustrative aspects disclosed herein, a corresponding gradient may be established on the basis of providing well-established semiconductor materials, such as silicon and germanium, with a varying concentration in order to obtain the desired gradient. Consequently, by appropriately adjusting the gradient with respect to the expected current flow direction, superior transistor performance may be achieved for this specific current flow direction, thereby implementing an asymmetric transistor configuration, which may be readily taken into account by appropriately designing the circuitry under consideration.

One illustrative method disclosed herein relates to forming a field effect transistor. The method comprises forming a channel semiconductor alloy on a semiconductor base material of an active region so as to have a varying concentration of the alloy forming species along a current flow direction. Moreover, the method comprises forming a gate electrode structure on the active region so as to be positioned on at least a portion of the channel semiconductor alloy. The method further comprises forming drain and source regions in the active region.

One illustrative method disclosed herein comprises forming a channel region in an active region of a transistor by varying a band gap of a channel material along a current flow direction in the channel region. The method further comprises forming a gate electrode structure on the channel region and forming drain and source regions of the transistor.

One illustrative semiconductor device disclosed herein comprises a gate electrode structure formed on a channel region and comprising a gate dielectric layer that forms an interface with a semiconductor alloy of the channel region. The semiconductor alloy comprises a species having a concentration gradient along a current flow direction. Furthermore, the semiconductor device comprises drain and source regions that are formed in the active region.

BRIEF DESCRIPTION OF THE DRAWINGS

The disclosure may be understood by reference to the following description taken in conjunction with the accompanying drawings, in which like reference numerals identify like elements, and in which:

FIG. 3b schematically illustrates the band gap variation in the channel region of the transistor of FIG. 3a;

Figure 1:
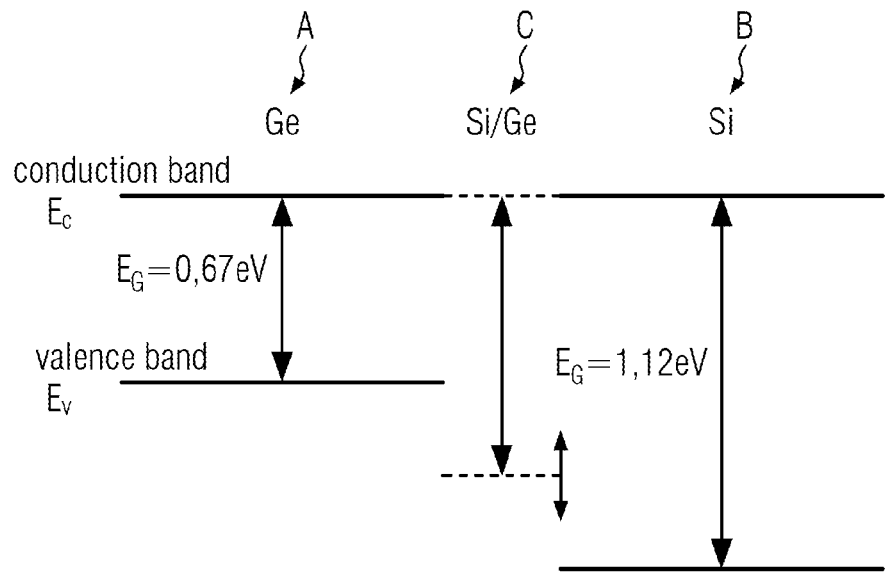
FIG. 1 schematically illustrates the band gaps of silicon and germanium and the band gap of a silicon/germanium alloy.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and semiconductor devices in which transistor performance may be enhanced by modifying the charge carrier mobility, for instance the velocity thereof, in the channel region by implementing an asymmetric transistor configuration, wherein a gradient of the band gap energy may be established such that a specified current flow direction higher charge carrier velocity for a given drain and source voltage may be achieved. To this end, an appropriate semiconductor alloy may be incorporated into the channel region of a silicon base material wherein, in some illustrative embodiments, well-established materials such as germanium, carbon and the like may be used. Consequently, the well-known characteristics of alloy-forming species, such as germanium, may be taken advantage of by implementing an appropriate concentration gradient in the channel region, which may result in superior performance of sophisticated transistors, for instance transistors having a gate length of 50 nm and less. In some illustrative embodiments, the mechanism of providing a graded concentration along the current flow direction in the channel region may be combined with sophisticated gate electrode structures, which may require an appropriate adaptation of the band gap in order to obtain a desired threshold voltage. For example, sophisticated high-k metal gate electrode structures may be provided wherein the graded semiconductor alloy, such as a silicon/germanium alloy, may additionally result in a desired low threshold voltage, while at the same time enhancing overall hole mobility in the channel.

The incorporation of the semiconductor alloy in the channel region so as to have a desired concentration gradient may be accomplished by ion implantation, deposition strategies in combination with an anneal process, wherein various process strategies may be used prior to forming the gate electrode structures, while, in other cases, a self-aligned implementation of the concentration gradient may be accomplished. In other cases, the deposition and anneal techniques may be combined with providing an appropriately sized shape cavity which may have a portion below the gate electrode structure so as to enable the positioning of the alloy-forming species at or in the vicinity of the channel region.

In still other illustrative embodiments disclosed herein, the concept of implementing a concentration gradient of a semiconductor alloy-forming species may also be applied to semiconductor alloys, such as silicon/carbon, in which the variation of the band gap energy may be achieved by reducing the conduction band energy. Also in this case, superior transistor performance may be achieved for otherwise given transistor parameters and operating voltages.

FIG. 1 schematically illustrates a band model of a crystalline germanium material, indicated by A, and of a crystalline silicon material, indicated by B, which is typically used as a semiconductor base material in currently preferred manufacturing strategies for forming highly complex semiconductor devices on the basis of volume production techniques. As illustrated, germanium may have a band gap difference of approximately 0.67 eV, i.e., a difference between the uppermost valence band energy and the lowest conduction band energy, while a corresponding energy gap is approximately 1.12 eV for a crystalline silicon material. As indicated by C, the corresponding band gap energy of a silicon/germanium alloy may be between the germanium band gap and the silicon band gap, depending on the corresponding concentration of the alloy-forming species silicon and germanium. Consequently, by selecting a specific concentration of germanium, the valence band energy and thus the band gap difference may be appropriately adjusted, which is frequently applied in sophisticated transistors having high-k metal gate electrode structures in order to appropriately set the desired threshold voltage, as is also discussed above.

Figure 2:
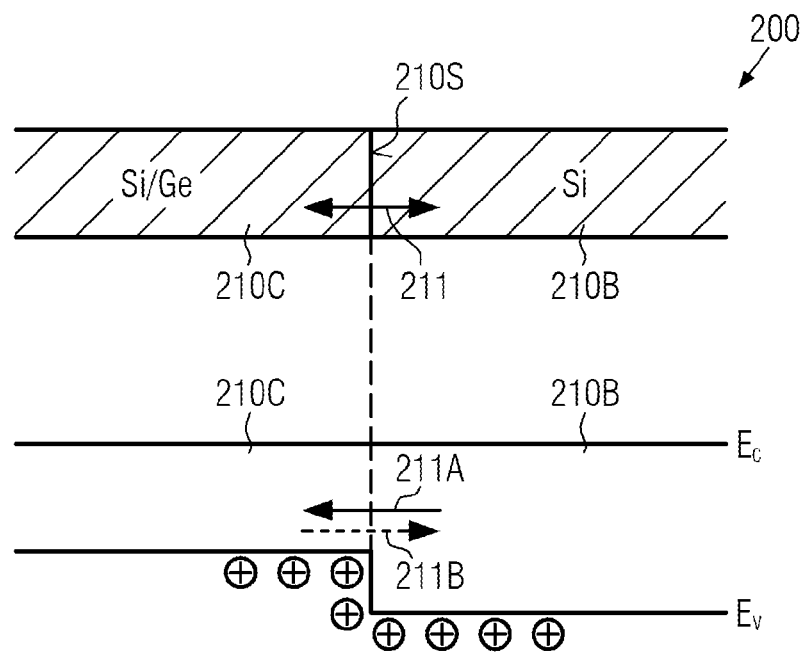
FIG. 2 schematically illustrates a silicon and a silicon/germanium region forming an interface with a corresponding schematic illustration of the conduction band and the valence band.

FIG. 2 schematically illustrates a corresponding combination of a silicon/germanium semiconductor region 210C and of a silicon semiconductor region 210B with a corresponding interface 210S. Moreover, a current flow is to be established in the semiconductor device 200 with a general current flow direction, as indicated by 211.

In the bottom portion of FIG. 2, the corresponding band model is illustrated in a highly simplified manner, wherein a corresponding change of the valence band energy is indicated at the interface 210S. It should be assumed that the current flow 211 is to be established on the basis of P-type conductors, i.e., holes. In this case, in a current flow direction 211A, i.e., a current flow from the silicon region 210B into the silicon/germanium region 210C, the charge carrier may experience a "drop" of the energy level, thereby enhancing, for instance, charge carrier velocity for a given voltage as required for inducing the current flow 211A. On the other hand, in the reverse direction 211B, a charge carrier may encounter a "barrier," thereby requiring sufficient energy to finally establish a current flow in the direction 211B. Consequently, the device 200 may be "asymmetric" with respect to its behavior upon establishing the current flow 211 in the semiconductor regions 210B, 210C. Hence, a corresponding effect may be taken advantage of so as to modify the conductivity behavior of a channel region in a transistor. To this end, a corresponding change in the band gap energy, which will also be referred to hereinafter as a gradient, may be implemented into the channel region of transistors, thereby obtaining superior performance for a predefined current flow direction.

Figure 3A:
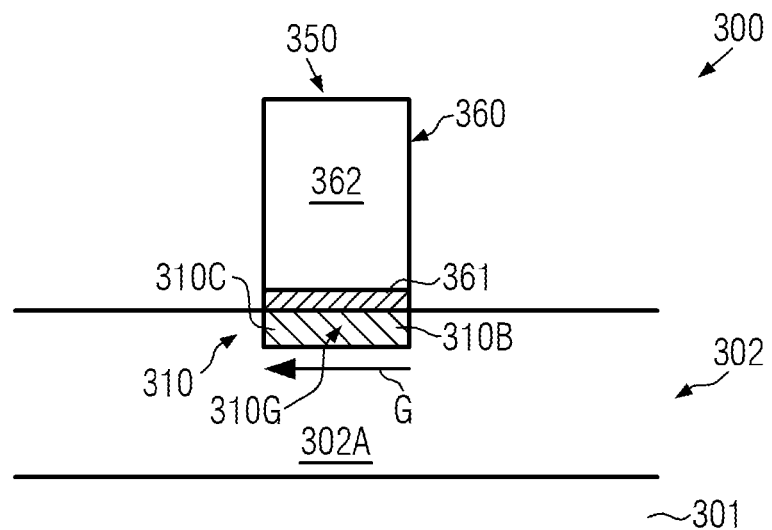
FIG. 3a schematically illustrates a cross-sectional view of a transistor in an early manufacturing stage in which a channel region comprises a gradient of the band gap energy along a current flow direction, according to illustrative embodiments.

FIG. 3a schematically illustrates a semiconductor device 300 in a manufacturing stage in which gate electrode structures 360 of a transistor 350 may be formed on an active region 302A, which may comprise a channel region 310. The active region 302A may be provided in a semiconductor layer 302, which, in some illustrative embodiments, may be comprised of a silicon base material, while, in particular in the channel region 310, additional species may be incorporated so as to obtain a desired gradient, as is also discussed above with reference to FIG. 2. It should be appreciated that the semiconductor layer 302 and the substrate 301 may form a silicon-on-insulator (SOI) configuration when a buried insulating material (not shown) may be formed below the semiconductor layer 302. In other cases, the semiconductor layer 302 may directly connect to a crystalline material of the substrate 301, thereby forming a bulk architecture.

As shown, the gate electrode structure 360 in this manufacturing stage may comprise a gate dielectric material 361, such as a silicon dioxide-based dielectric material, a dielectric material including a high-k dielectric material, depending on the overall complexity of the transistor 350. Moreover, an electrode material 362 may be formed on the gate dielectric material 361 and may have any appropriate configuration. For example, as discussed above, metal-containing electrode materials may be provided so as to provide superior conductivity, at least in the vicinity of the gate dielectric material 361, and also provide an appropriate work function. In other cases, the electrode material 362 may represent well-established semiconductor materials, such as polycrystalline silicon, silicon/germanium and the like. Furthermore, a length of the gate electrode structure 360, i.e., in FIG. 3a, the horizontal extension of the electrode material 362, may be 50 nm and less in sophisticated applications. Furthermore, the channel region 310, on which the gate dielectric material 361 is formed, may be comprised of a semiconductor alloy, such as a silicon/germanium alloy, wherein the concentration of the semiconductor alloy-forming species, such as the silicon and the germanium species, may vary along a current flow direction, which is generally the horizontal direction in FIG. 3a. The channel region 310 may be formed such that a gradient, indicated as G, may be established along the current flow direction so as to obtain superior performance due to a corresponding change of the band gap energy, as is also discussed above with reference to FIG. 2. For example, the gradient G may be established by providing a more or less pronounced interface between a first portion 310B and a second portion 310C, wherein a moderately pronounced change of the concentration of the silicon and germanium may occur, thereby obtaining a similar situation as described in FIG. 2 with reference to the semiconductor device 200. In other cases, at least a central region 310G may be provided, in which a graded transition of the alloy species concentration may occur between the portions 310C and 310B. For example, the concentration of the germanium species starting from the portion 310B may be zero to several atomic percent, depending on the desired overall characteristics of the transistor 350, and the corresponding germanium concentration may increase towards the portion 310C, which may have a desired "end" concentration, for instance in the range of 20-30 atomic percent and higher, if required.

Figure 3B:
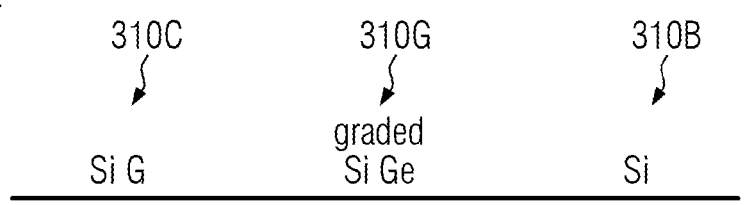

FIG. 3b schematically illustrates the band gap variation for the channel region 310 in the case of a silicon base material and a silicon/germanium alloy. In the example shown in FIG. 3b, the region 310B may substantially correspond to a silicon region, while, in the central region 310G, the germanium concentration may grow up to a desired value established in the end portion 310C. Consequently, upon establishing a current flow by holes as charge carriers, as indicated by 311, the charge carriers 311 may gain additional velocity compared to a situation in which a silicon channel region would be provided. In this manner, an asymmetric transistor configuration may be implemented, however, without requiring a modification of the basic geometry of the transistor 350 (FIG. 3a).

Figure 3C:
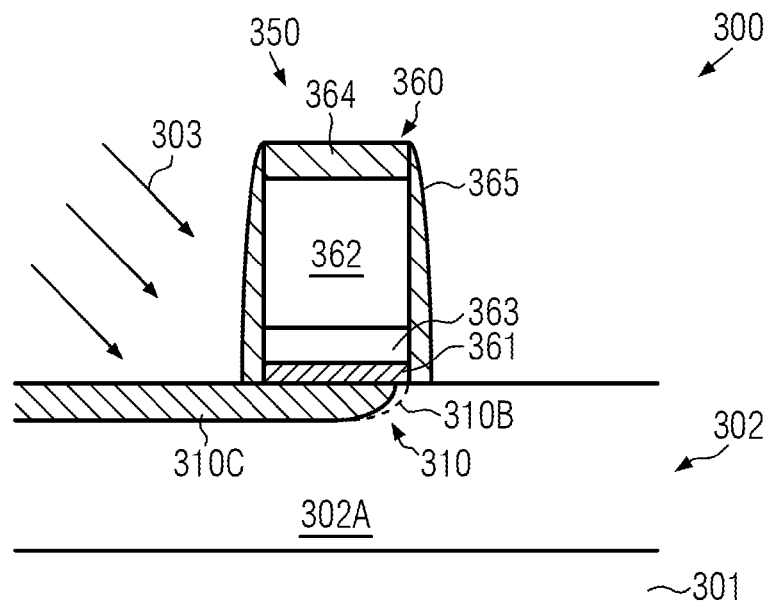
FIG. 3c schematically illustrates a cross-sectional view of the semiconductor device according to illustrative embodiments in which the desired gradient in an alloy-forming species may be accomplished on the basis of an implantation process in the presence of a gate electrode structure.

FIG. 3c schematically illustrates a cross-sectional view of the semiconductor device 300 according to illustrative embodiments in which the channel region 310 having the desired gradient in the band gap energy may be obtained on the basis of well-established implantation techniques in the presence of the gate electrode structure 360. As shown, the gate electrode structure 360 may be formed on the active region 302A, which may initially be provided in the form of the base material of the semiconductor layer 302, for instance in the form of a silicon material. The active region 302A may be formed in the semiconductor layer 302 on the basis of well-established process techniques, for instance providing isolation regions (not shown) so as to laterally delineate the active region 302A so as to have the desired lateral size and shape. Thereafter, appropriate materials may be formed, for instance, by oxidation, deposition and the like, followed by a subsequent complex lithography and patterning strategy in order to form the gate electrode structure 360 with a desired gate length. In the embodiment shown, the gate dielectric material 361 may comprise a high-k dielectric material, for instance in the form of hafnium oxide and the like, which may be formed as a dedicated layer on the active region 302A, while, in other cases, a conventional dielectric material with a reduced thickness, such as silicon dioxide and the like, may be provided in combination with the high-k dielectric material. Moreover, a metal-containing electrode material 363 may be formed on or above the gate dielectric material 361 and may have incorporated therein appropriate species for adjusting a desired value of the work function, as is also discussed above. Furthermore, the material 362 may be formed above the layer 363, followed by a dielectric cap layer or cap layer system 364, which may be used as a hard mask material during the patterning of the underlying material layers and which may also be used during the further processing, if required. Moreover, a sidewall spacer structure 365 may be provided so as to confine the sensitive materials 361 and 363. After completing the gate electrode structure 360, an implantation process 303 may be applied in order to introduce an alloy-forming species in order to form the channel region 310 having the graded concentration. To this end, germanium may be incorporated during the implantation process 303, which may be performed on the basis of a tilted implantation step, possibly with a varying tilt angle and the like, in order to position the germanium species below the gate electrode structure 360, while forming a substantially uniform germanium concentration in any exposed portions of the active regions 302A, which are not shadowed by the gate electrode structure 360. In this manner, the portion 310C may be formed while the respective germanium concentration may be adjusted on the basis of the implantation parameters of the process 303. It should be appreciated that the spacer structure 365 may have any appropriate thickness so as to avoid undue penetration of sensitive materials, such as the layers 361, 363, if considered inappropriate for the further processing of the device 300. In this manufacturing stage, also any other implantation processes may be performed, if required, for instance drain and source dopant species, halo dopant species, i.e., dopant species for locally increasing the well dopant concentration of the active region 302A, may be incorporated if desired. Thereafter, appropriate anneal processes may be applied so as to activate the germanium species by positioning a high fraction of the implanted germanium species at lattice sites. It should be appreciated that, in some cases, an appropriate anneal process may be specifically performed so as to adjust the finally obtained size and shape of the channel region 310, for instance by promoting a certain degree of diffusion, thereby also obtaining the portion 310B. It should be appreciated that generally, due to the nature of the process 303, a graded concentration of the germanium species may be obtained below the gate electrode structure 360, thereby achieving the desired varying concentration, irrespective of the degree of diffusion initiated during any further anneal processes. Consequently, after the implantation process 303, the further processing may be continued by incorporating drain and source dopant species and the like, as is required for completing the transistor 350.

Figure 3D:
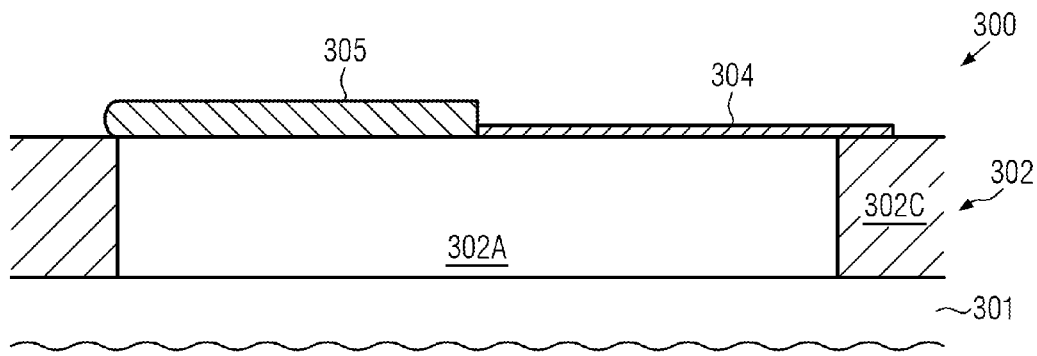
FIGS. 3d-3f schematically illustrate cross-sectional views of the semiconductor device according to still further illustrative embodiments in which a desired gradient in the band gap energy may be accomplished by using deposition and anneal techniques so as to obtain a desired gradient prior to forming the gate electrode structure.

FIG. 3d schematically illustrates the semiconductor device 300 in an early manufacturing stage according to further illustrative embodiments in which, in addition to or alternatively to the incorporation of an alloy-forming species by implantation, deposition and anneal techniques may be applied. As illustrated, the active region 302A may be delineated by an isolation region 302C and a mask layer 304 may be formed above a portion of the active region 302A. Moreover, a layer 305 may be formed on a portion of the active region 302A, which is not covered by the hard mask 304. To this end, the mask layer 304 may be formed on the active region 302A and may be subsequently removed from a portion thereof by applying corresponding lithography techniques and etch processes. For example, a resist mask may be formed above the active region 302A and wet chemical etch recipes, such as hydrofluoric acid (subsequently), hot phosphoric acid, may be applied when the hard mask 304 is formed of silicon dioxide and silicon nitride, respectively. In other cases, plasma-assisted etch recipes may be applied. After exposing a portion of the active region 302A, the layer 305 may be deposited which, in some illustrative embodiments, may be accomplished by applying selective epitaxial growth techniques, thereby selectively forming the material layer 305 on the exposed portion of the active region 302A. To this end, well-established process techniques for forming a silicon/germanium material or a germanium material may be applied. On the other hand, the mask 304 may efficiently block any material deposition above the remaining portion of the active region 302A and also above any other semiconductor regions in which the incorporation of the alloy-forming species is not required. It should be appreciated that, in other illustrative embodiments (not shown), the layer 305 may also be formed above the hard mask 304, if the mask provides sufficient diffusion blocking capabilities so as to at least significantly reduce the diffusion of an alloy-forming species into the active region 302A below the mask 304.

Figure 3E:
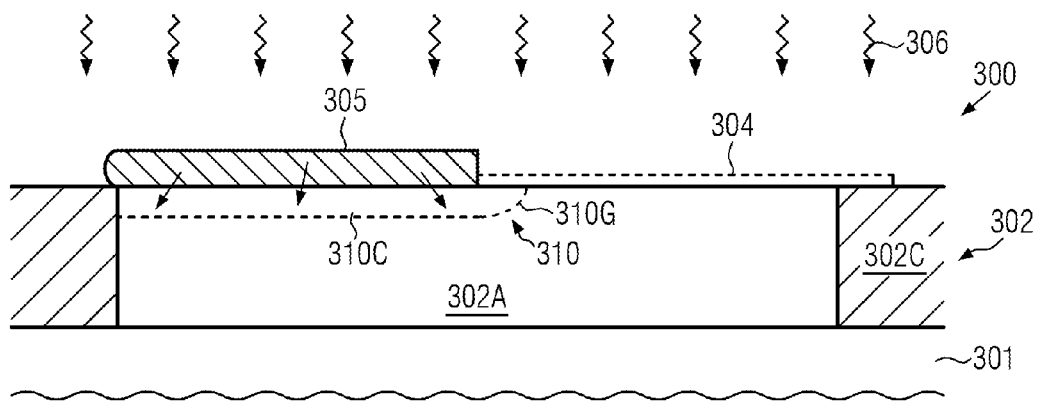

FIG. 3e schematically illustrates the device 300 in a further advanced manufacturing stage. As shown, the mask 304 may be removed, if considered appropriate, while in other cases the mask 304 may still be retained during an anneal process 306, which may be performed on the basis of appropriate anneal parameters, such as temperature and duration, in order to initiate a diffusion of an alloy-forming species, such as germanium, into the active region 302A. In this manner, the channel region 310 may be formed so as to have the substantially graded portion 310G and the portion 310C of substantially uniform concentration. It should be appreciated that the finally obtained concentration and concentration gradient may be adjusted on the basis of the material composition of the layer 305 and the anneal parameters. To this end, well-established anneal processes may be applied, such as rapid thermal anneal (RTA), laser-based anneal processes, flashlight-based anneal processes and the like, wherein appropriate parameters may be readily determined on the basis of experiments and the like.

Figure 3F:
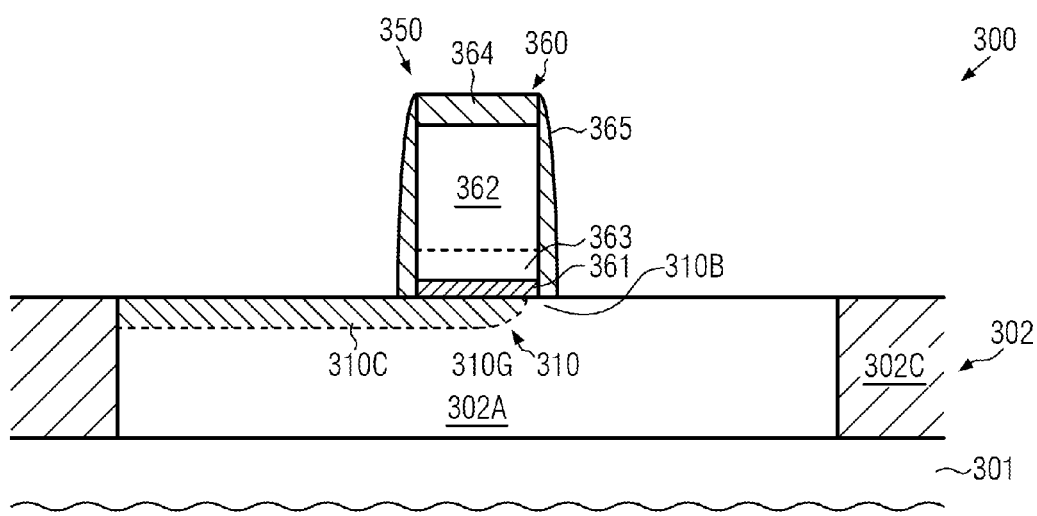

FIG. 3f schematically illustrates the device 300 in a further advanced manufacturing stage. As illustrated, the gate electrode structure 360 is formed at least partially above the graded portion 310G so that the channel region 310 may have the end portion 310B, which may substantially correspond to the semiconductor base material of the active region 302A. On the other hand, the portion 310C may have a substantially uniform concentration as suggested previously on the basis of the process 306 and the layer 305 (FIG. 3e). Consequently, in this manner, the channel region 310 comprising the graded portion 310G may be provided prior to forming the gate electrode structure 360, which may be advantageous when using anneal processes on the basis of process parameters that would be compatible with the gate electrode structure 360.

Figure 3G:
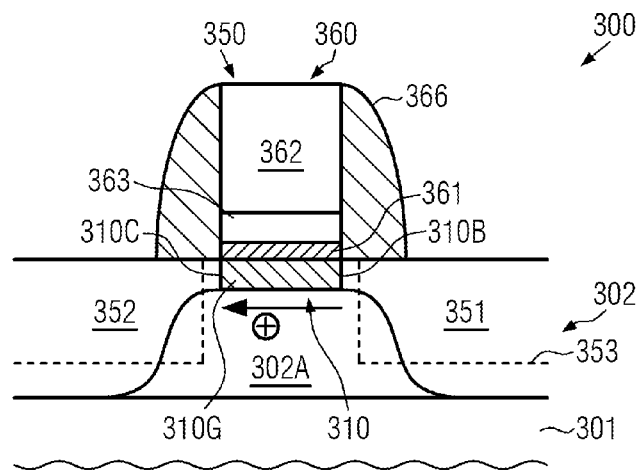
FIG. 3g schematically illustrates a cross-sectional view of the transistor in a further advanced manufacturing stage in which the basic transistor configuration is completed so as to comprise the desired gradient in the band gap energy for superior transistor performance.

FIG. 3g schematically illustrates the semiconductor device 300 in a further advanced manufacturing stage according to illustrative embodiments. As shown, the transistor 350 may comprise highly doped semiconductor regions 351, 352, which may also be referred to as drain and/or source regions. The regions 351, 352 may be formed by ion implantation, possibly in combination with an appropriate configured spacer structure 366 of the gate electrode structure 360 in order to obtain a desired vertical and lateral dopant profile, as is also discussed above. Consequently, the doped regions 351, 352 may connect to the channel region 310, i.e., the doped region 351 may connect to a portion 310B, while the doped region 352 may connect to the end portion 310C, while the central portion 310G may provide the desired graded transition between the portions 310B and 310C. In the embodiment shown, it may be assumed that the transistor 350 may be a P-channel transistor, so that a current flow may be established on the basis of holes between the regions 351 and 352 by appropriately applying a corresponding external voltage to the transistor 350. It should be appreciated that the channel region 310 having the desired gradient in band gap energy or in concentration of alloy-forming species may be formed in accordance with any of the above-described process techniques or on the basis of any process techniques still to be described later on.

Moreover, as indicated by the dashed lines, in sophisticated applications, a strain-inducing semiconductor alloy 353 may be incorporated into the active region 302A so as to induce a desired type of strain in the channel region 310, as is also previously discussed.

The transistor 350 as shown in FIG. 3g may be formed on the basis of any appropriate process strategy, while the incorporation of the channel region 310 may be accomplished by incorporating alloy-forming species, such as germanium, so as to obtain the desired concentration gradient, as is discussed above or as may be described later on.

Moreover, as discussed above, the gate electrode structure 360 may comprise the dielectric material 361 in the form of a material containing a high-k dielectric material in combination with a work function adjusting metal species, for instance incorporated in the material 361 and/or in the conductive layer 362. In this case, the channel region 310 may generally be appropriately configured so as to adjust the resulting threshold voltage of the transistor 350. To this end, appropriate maximum concentrations of the end portions 310B, 310C and position of the concentration between these two end portions may be appropriately selected so as to obtain the desired threshold voltage. To this end, electrical measurement data may be obtained for different configurations of the channel region 310 in order to select appropriate process parameters for forming the channel region 310.

Figure 3H:
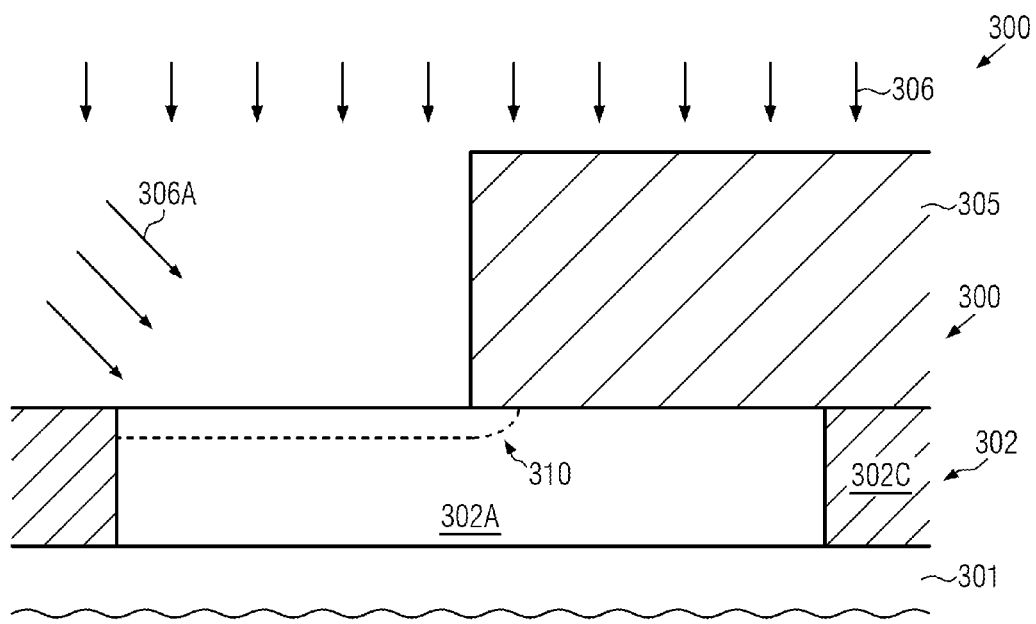
FIGS. 3h-3j schematically illustrate cross-sectional views of the semiconductor device according to various embodiments in which a varying concentration of alloy-forming species may be accomplished.

FIG. 3h schematically illustrates the semiconductor device 300 according to further illustrative embodiments in which the channel region 310 may be formed in an early manufacturing stage, for instance by using an implantation process or process sequence 306, 306A. To this end, an implantation mask 305, for instance in the form of a resist mask, may be formed above the active region 302A so as to expose a certain portion thereof. Consequently, a desired alloy-forming species, such as germanium, may be incorporated with a desired dose, wherein, for instance by applying a tilted implantation, such as an implantation process 306A, a graded profile may be obtained below the implantation mask 305. In other cases, during the substantially non-tilted implantation 306, a desired germanium concentration may be formed in the exposed portion of the active region 302A, wherein a corresponding lateral gradient may be established during the subsequent anneal process. That is, after removal of the implantation mask 305, appropriate anneal parameters may be applied so as to initiate a corresponding diffusion, which may thus also result in a lateral diffusion, thereby forming a laterally decreasing concentration of the incorporated alloy-forming species. Thereafter, the further processing may be continued as is also discussed above, for instance, by forming a gate electrode structure.

Figure 3I:
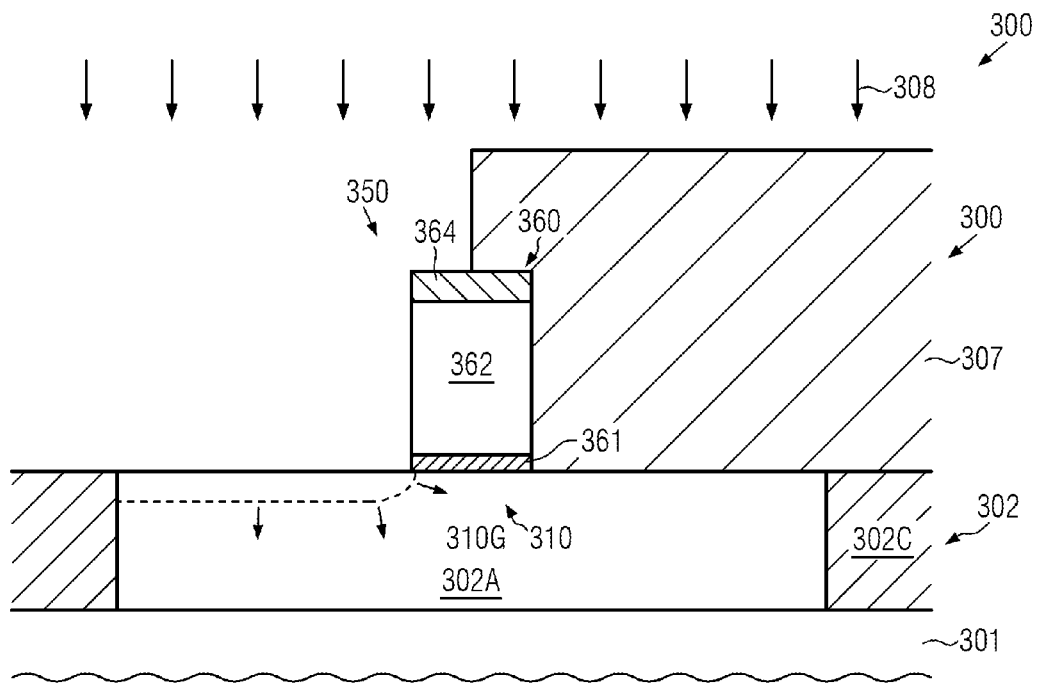

FIG. 3i schematically illustrates the device 300 according to still further illustrative embodiments in which the gate electrode structure 360 may be formed on the active region 302A and an implantation mask 307 may cover one half of the active region 302A, while exposing the other half so as to incorporate the alloy-forming species by an implantation process 308. In this case, the implantation process 308 may be performed on the basis of small tilt angles, if required, while also a substantially orthogonal implantation may be used without affecting the remaining portion of the active region 302A. A corresponding masking of this portion of the active region 302A may be highly advantageous in densely packed device areas in which a tilt angle may not be arbitrarily increased due to the reduced pitch of adjacent gate electrode structures. In the embodiment shown, the gate electrode structure 360 may be provided in the form of a well-established dielectric material and a semiconductor-based electrode material, wherein also the cap material 364 may suppress undue incorporation of the alloy-forming species during the implantation process 308. In this configuration, any anneal processes may be applied so as to re-crystallize implantation-induced damage and also initiate diffusion of the alloy-forming species, thereby also positioning the species below the gate electrode structure 360.

Figure 3J:
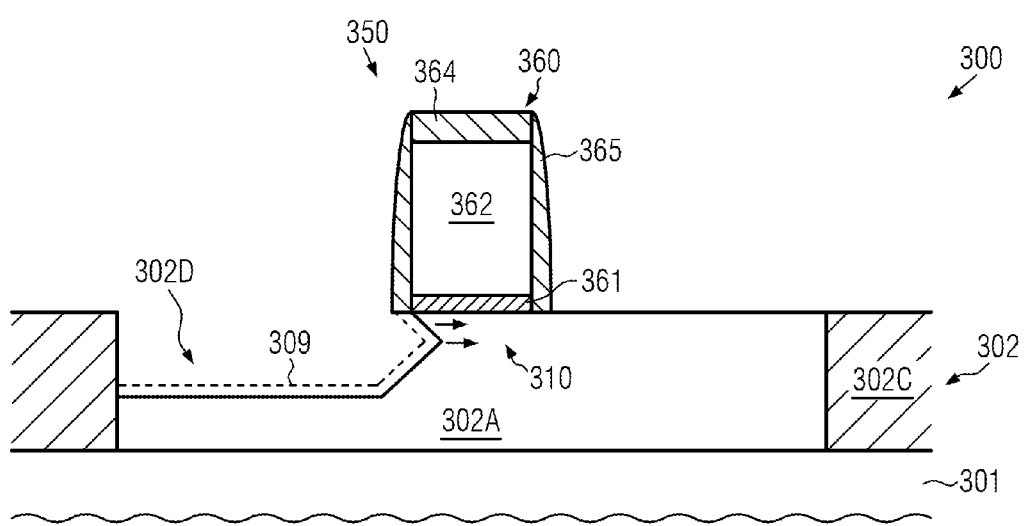

FIG. 3j schematically illustrates the device 300 according to still further illustrative embodiments in which a cavity 302D may be formed in one side of the active region 302A, wherein the cavity 302D may have any appropriate shape so as to form therein a layer 309 that may be used to induce diffusion of an alloy-forming species into the channel region 310. For example the cavity 302D may be formed on the basis of crystallographically anisotropic etch techniques in which certain crystal planes may act as efficient etch stop layers. In this case, the lateral extension of the cavity 302D below the gate electrode structure 360 may be efficiently controlled due to the self-limiting nature of the corresponding etch process. On the other hand, undue etch damage of the layer 361 may be avoided, even if a pronounced degree of under-etching may be applied. In other cases, the cavity 302D may be formed on the basis of plasma assisted etch recipes in combination with isotropic etch processes so as to obtain a desired lateral etch rate. Thereafter, the layer 309 may be deposited, for instance, by selective epitaxial growth techniques and the like so as to include a desired concentration of an alloy-forming species, such as germanium, which may be subsequently diffused into the channel region 310 on the basis of an appropriate anneal process. It should be appreciated that the cavity 302D may not necessarily be filled completely by the layer 309 when the presence of the corresponding material is considered inappropriate for the further processing or the characteristics of the transistor still to be formed. In other cases, in addition to the layer 309, further material may be filled in so as to have appropriate characteristics, for instance by providing an in situ doped semiconductor material, by inducing a desired type of strain in the channel region 310 and the like.

The cavity 302D may be formed by appropriately masking a portion of the active region 302A, as is for instance illustrated in FIG. 3i, wherein a resist mask may be used for patterning a hard mask material, such as an oxide material, a nitride material and the like.

If the layer 309 is to be removed, the cavity 302D may then be filled with any appropriate semiconductor material on the basis of selective epitaxial growth techniques, and, after removal of any hard mask materials, the further processing may be continued by anneal processes and incorporation of drain and source dopant species and the like.

Figure 3K:
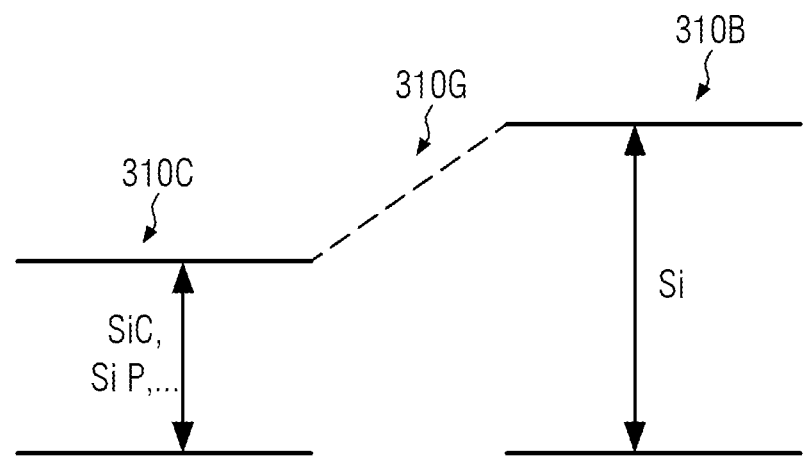
FIGS. 3k and 3l schematically illustrate band gap energies and a corresponding transistor device in which other semiconductor alloy-forming species, such as carbon, may be implemented into the channel region in order to enhance transistor performance, according to further illustrative embodiments.

FIG. 3k schematically illustrates a band gap scheme of end portions 310C and 310B, i.e., of a semiconductor alloy and silicon, wherein a reduction in the band gap may be obtained on the basis of a different conduction band energy. In this manner, also a portion 310G of varying band gap energy may be implemented. To this end, similar process techniques may be applied as previously discussed, wherein an appropriate alloy-forming species, such as carbon, phosphorus and the like, may be used.

Figure 3L:
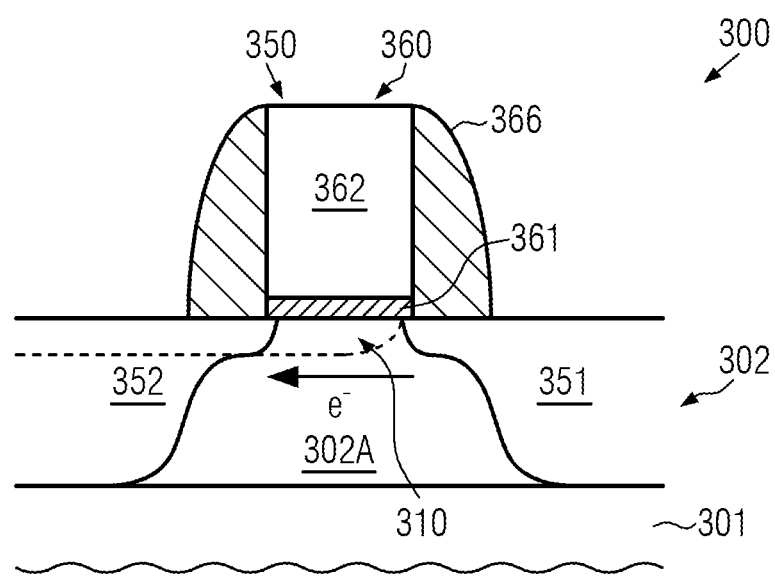

FIG. 3*l* schematically illustrates a cross-sectional view of the device 300 wherein the transistor 350 may have incorporated therein a channel region 310 with a concentration profile for enhancing mobility of electrons between the highly doped regions 351, 352, which may represent highly N-doped semiconductor regions.

As a result, the present disclosure provides semiconductor devices and manufacturing techniques in which a gradient, i.e., a change of the band gap energy of the semiconductor material in the channel region in a direction of current flow, may be obtained, for instance in a planar transistor configuration, along the channel length direction, thereby providing superior charge carrier behavior, at least in one current flow direction. To this end, alloy-forming species, such as germanium, may be incorporated so as to obtain a concentration gradient in the channel length direction, which may be accomplished by implantation and anneal techniques, diffusion layers and the like. Consequently, a higher charge carrier velocity may be obtained in the channel without having to employ unknown materials or new stress inducing techniques. In particular in transistors comprising sophisticated high-k metal gate electrode structures, a silicon/germanium alloy may currently be used as performance enhancing channel material and may also be used for adjusting an appropriate threshold voltage. The superior carrier velocity translates into higher drive current and generally higher transistor performance, thereby resulting in, for instance, a higher switching speed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a field effect transistor, the method comprising:
   forming a channel semiconductor alloy by introducing at least one alloy-forming species into a semiconductor base material of an active region so as to have a varying concentration of said at least one alloy-forming species along a current flow direction;
   forming a gate electrode structure on said active region so as to be positioned on at least a portion of said channel semiconductor alloy; and
   forming drain and source regions in said active region.

2. The method of claim 1, wherein forming said channel semiconductor alloy comprises forming a silicon-containing semiconductor alloy.

3. The method of claim 2, wherein said channel semiconductor alloy is formed so as to comprises at least one of a germanium species and a carbon species.

4. The method of claim 1, wherein forming said channel semiconductor alloy comprises introducing said at least one alloy-forming species into said semiconductor base material by performing an ion implantation process.

5. The method of claim 4, wherein said ion implantation process is performed in the presence of said gate electrode structure by using a tilt angle.

6. The method of claim 1, wherein forming said channel semiconductor alloy comprises forming a material layer including said at least one alloy-forming species selectively on a portion of said semiconductor base material and initiating diffusion of said at least one alloy-forming species into said semiconductor base material.

7. The method of claim 6, wherein said material layer including said at least one alloy-forming species is formed prior to forming said gate electrode structure.

8. The method of claim 1, wherein forming said gate electrode structure comprises providing a high-k dielectric material in a gate insulation layer of said gate electrode structure.

9. The method of claim 8, wherein forming said gate electrode structure further comprises providing a work function metal species in said gate electrode structure prior to forming said drain and source regions.

10. A method, comprising:
    forming a channel region in an active region of a transistor by varying a band gap of a channel material along a current flow direction of said channel region by introducing at least on alloy-forming species into a semiconductor base material in the channel region;
    forming a gate electrode structure on said channel region; and
    forming drain and source regions of said transistor.

11. The method of claim 10, wherein varying a band gap of said channel material comprises varying a material composition of a semiconductor alloy.

12. The method of claim 11, wherein said semiconductor alloy comprises silicon.

13. The method of claim 12, wherein said semiconductor alloy further comprises at least one of germanium and carbon.

14. The method of claim 11, wherein introducing said at least one alloy-forming species into the semiconductor base material in the channel region comprises introducing said at least one alloy-forming species by performing an ion implantation process.

15. The method of claim 11, wherein introducing said at least one alloy-forming species into the semiconductor base material in the channel region comprises diffusing said at least one alloy-forming species into a portion of said semiconductor base material.

* * * * *

UNITED STATES PATENT AND TRADEMARK OFFICE
CERTIFICATE OF CORRECTION

PATENT NO. : 8,501,601 B1  
APPLICATION NO. : 13/239672  
DATED : August 6, 2013  
INVENTOR(S) : Stefan Flachowsky et al.

Page 1 of 1

It is certified that error appears in the above-identified patent and that said Letters Patent is hereby corrected as shown below:

In the Claims

Col. 14, line 33 (claim 10, line 5), change "at least on" to -- at least one --.

Signed and Sealed this
Twenty-sixth Day of November, 2013

Margaret A. Focarino
*Commissioner for Patents of the United States Patent and Trademark Office*